(12) United States Patent
Chang et al.

(10) Patent No.: US 10,274,663 B2
(45) Date of Patent: Apr. 30, 2019

(54) LIGHT GUIDE PLATE, BACKLIGHT MODULE AND DISPLAY DEVICE

(71) Applicants: Radiant Opto-Electronics (Suzhou) Co.,Ltd., Jiangsu (CN); Radiant Opto-Electronics Corporation, Kaohsiung (TW)

(72) Inventors: Chia-Yin Chang, Kaohsiung (TW); Chin-Ting Weng, Kaohsiung (TW); Shin-Bo Lin, Kaohsiung (TW)

(73) Assignees: Radiant Opto-ELectronics (Suzhou) CO., Ltd., Jiangsu (CN); Radiant Opto-Electronics Corporation, Kaohsiung (TW)

( * ) Notice: Subject to any disclaimer, the term of this patent is extended or adjusted under 35 U.S.C. 154(b) by 82 days.

(21) Appl. No.: 15/446,007

(22) Filed: Mar. 1, 2017

(65) Prior Publication Data
US 2017/0336551 A1    Nov. 23, 2017

Related U.S. Application Data

(63) Continuation of application No. PCT/CN2016/086224, filed on Jun. 17, 2016.

(30) Foreign Application Priority Data

May 18, 2016    (CN) .......................... 2016 1 0330775

(51) Int. Cl.
*G02B 6/00* (2006.01)
*F21V 8/00* (2006.01)
(Continued)

(52) U.S. Cl.
CPC ......... *G02B 6/0036* (2013.01); *G02B 6/0033* (2013.01); *G02B 6/0058* (2013.01);
(Continued)

(58) Field of Classification Search
None
See application file for complete search history.

(56) References Cited

U.S. PATENT DOCUMENTS

2013/0170250 A1*  7/2013  Kikuchi ............... G02B 6/0038
                                                    362/609
2014/0118661 A1   5/2014  Qi et al.

FOREIGN PATENT DOCUMENTS

CN    101042449 A    9/2007
CN    101093315 A    12/2007
(Continued)

*Primary Examiner* — Andrew J Coughlin
(74) *Attorney, Agent, or Firm* — CKC & Partners Co., LLC

(57) ABSTRACT

A light guide plate, a backlight module and a display device are provided. The light guide plate includes a main body, plural first stripe structures and plural second stripe structures. The main body has at least one light-incident surface and a main surface connected to the at least one light-incident surface. The first stripe structures are arranged on plural first regions of the main surface, in which each of the first stripe structures has a first tapered portion. The second stripe structures are arranged on a plurality of second regions of the main surface, in which each of the second stripe structures has a second tapered portion. The first areas and the second areas of the main surface are alternately disposed, and an inherent type of the second stripe structures is different from an inherent type of the first stripe structures.

14 Claims, 15 Drawing Sheets

(51) Int. Cl.
*H01L 25/075* (2006.01)
*H05K 1/18* (2006.01)

(52) U.S. Cl.
CPC ......... *H01L 25/0753* (2013.01); *H05K 1/181* (2013.01); *G02B 6/002* (2013.01); *G02B 6/0061* (2013.01); *H05K 2201/10106* (2013.01); *Y02P 70/611* (2015.11)

(56) References Cited

FOREIGN PATENT DOCUMENTS

| | | |
|---|---|---|
| CN | 201407548 Y | 2/2010 |
| CN | 101718417 A | 6/2010 |
| CN | 102621621 A | 8/2012 |
| CN | 102866452 A | 1/2013 |
| CN | 103257391 A | 8/2013 |
| CN | 103823272 A | 5/2014 |
| CN | 103869405 A | 6/2014 |
| CN | 105388556 A | 3/2016 |
| JP | 2013143326 A | 7/2013 |
| TW | 201608289 A | 3/2016 |
| TW | 201614291 A | 4/2016 |

* cited by examiner

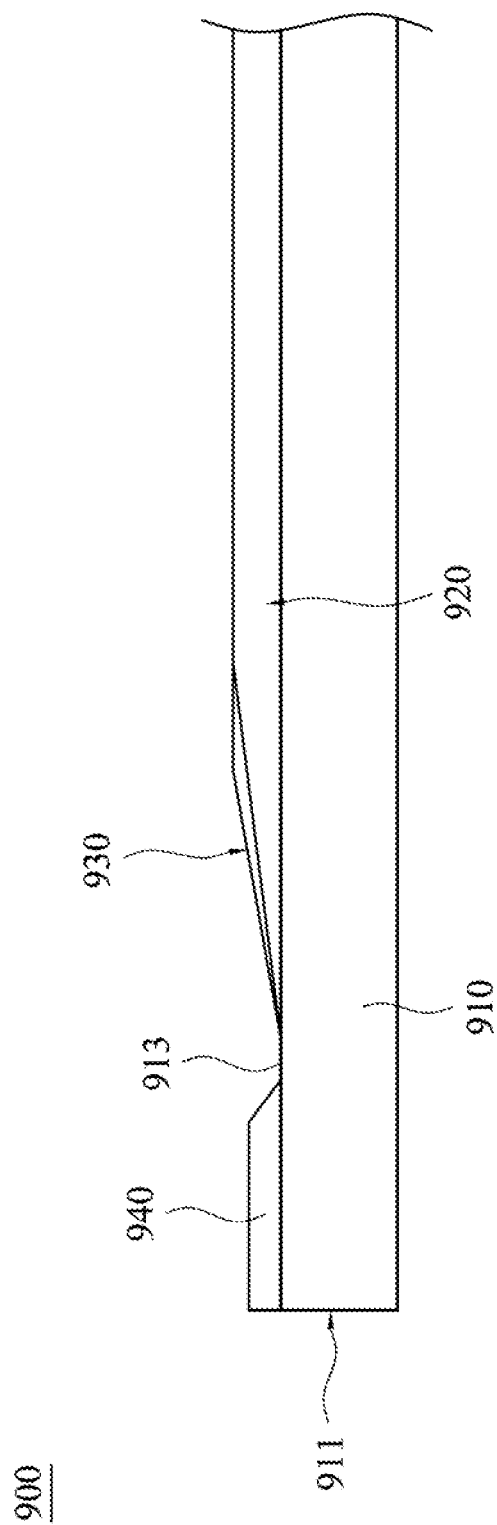

LIGHT GUIDE PLATE, BACKLIGHT MODULE AND DISPLAY DEVICE

RELATED APPLICATIONS

This application is a continuation application of International Application No. PCT/CN2016/086224 filed Jun. 17, 2016, which claims priority to China Application Serial Number 201610330775.4, filed on May 18, 2016, which is incorporated herein by reference.

BACKGROUND

Field of Invention

The present invention relates to a light guide element and its application. More particularly, the present invention relates to a light guide plate and its applications in a backlight module and a display device.

Description of Related Art

A conventional backlight module mainly includes a light bar and a light guide plate. The light bar includes a circuit board and plural light-emitting diodes disposed on the circuit board. The light guide plate is disposed adjacent to the light-emitting diodes, and a light-incident surface of the light guide plate can contact a light-emitting surface of each of the light-emitting diodes or can be spaced from the light-emitting surface of each of the light-emitting diodes at a small distance, thereby effectively improving light efficiency generated from the light-emitting diodes.

However, because the light-incident surface of the light guide plate is connected to the light-emitting surface of each of the light-emitting diodes the light-emitting surface of each light-emitting diode or is spaced from the light-emitting surface of each of the light-emitting diodes at a little distance, a hotspots phenomenon or a non-uniform brightness phenomenon is likely to occur on a portion of the light guide plate adjacent to the light-emitting diodes, thus affecting the optical appearance of the light guide plate.

SUMMARY

One object of the present invention is to provide a light guide plate, a backlight module and a display device, in which the light guide plate has plural stripe structures which can be used to reduce the non-uniform brightness phenomenon adjacent to the light-incident side of the light guide plate, thereby increasing illumination uniformity of the backlight module and the display device.

According to the aforementioned object, a light guide plate is provided. The light guide plate includes a main body, plural first stripe structures and plural second stripe structures. The main body has at least one light-incident surface and a main surface connected to the at least one light-incident surface. The first stripe structures are arranged on plural first regions of the main surface, in which each of the first stripe structures has a first tapered portion. The second stripe structures are arranged on a plurality of second regions of the main surface, in which each of the second stripe structures has a second tapered portion. The first areas and the second areas of the main surface are alternately disposed, and an inherent type of the second stripe structures is different from an inherent type of the first stripe structures.

According to an embodiment of the present invention, an extending direction of each of the first stripe structures and the second stripe structures is vertical to the light-incident surface. A width of each of the first tapered portions and the second tapered portions becomes greater from one end adjacent to the light-incident surface to the other end away from the light-incident surface.

According to an embodiment of the present invention, the light-incident surface includes a first light-incident surface and a second light-incident surface opposite to the first light-incident surface. Each of the first stripe structures further has a third tapered portion opposite to the first tapered portion. Each of the second stripe structures further has a fourth tapered portion opposite to the second tapered portion.

According to an embodiment of the present invention, a width of each of the third tapered portions and the fourth tapered portions becomes greater from one end adjacent to the light-incident surface to the other end away from the light-incident surface.

According to an embodiment of the present invention, a length of the third tapered portion of each of the first stripe structures is different from a length of the fourth tapered portion of each of the second stripe structures.

According to an embodiment of the present invention, a width of each of the first stripe structures is different from a width of each of the second stripe structures.

According to an embodiment of the present invention, each of the first stripe structures and the second stripe structures is a concave portion, and a depth of each of the first stripe structures is different from a depth of each of the second stripe structures.

According to an embodiment of the present invention, each of the first stripe structures and the second stripe structures is a convex portion, and a height of each of the first stripe structures is different from a height of each of the second stripe structures.

According to an embodiment of the present invention, each of the first stripe structures has a first body portion, each of the second stripe structures has a second body portion, and a length of the first body portion of the each of the first stripe structures is different from a length of the second body portion of each of the second stripe structures.

According to an embodiment of the present invention, a length of the first tapered portion of each of the first stripe structures is different from a length of the second tapered portion of each of the second stripe structures.

According to an embodiment of the present invention, the main surface is a light-emitting surface or a reflecting surface.

According to the aforementioned object, a backlight module is provided. The backlight module includes the aforementioned light guide plate and at least one light source. The light source is disposed adjacent to the at least one light-incident surface of the light guide plate, in which the light source includes a circuit board and a plurality of light-emitting diodes disposed on the circuit board.

According to an embodiment of the present invention, the first regions are respectively disposed in front of the light-emitting diodes, and the second regions are disposed between every two adjacent first regions.

According to an embodiment of the present invention, a fan-shaped blank area is defined between the first stripe structures in each of the first regions and the light-emitting diode corresponding to the each of the first regions.

According to an embodiment of the present invention, in an extending direction of each of the first stripe structures and the second stripe structures, a distance between each of the first stripe structures in the first regions and the light-emitting diodes is equal to a distance between each of the second stripe structures in the second regions and the light-emitting diodes.

According to the aforementioned object, a display device is provided. The display device includes the aforementioned backlight module and a display panel. The display panel is disposed in front of the light guide plate.

It can be known from the aforementioned embodiments of the present invention that, the light guide plate has different first stripe structures and second stripe structures disposed on the main surface of the light guide plate, and the shapes and the structures of the first stripe structures and the second stripe structures are design according to a luminous intensity and a light distribution generated from the light source, thereby increasing the degree of the illumination uniformity of the backlight module and the display device.

In addition, in different embodiments, the main surface near the light-incident surface can be implemented with plural microstructures, and these microstructures are used to mix light entering the light-incident portion of the light guide plate, thereby enhancing the luminance uniformity of the light guide plate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment with reference made to the accompanying drawings as follows:

FIG. 7B is a schematic partial side view of the light guide plate in accordance with the seventh embodiment of the present invention;

DETAILED DESCRIPTION

Figure 1:
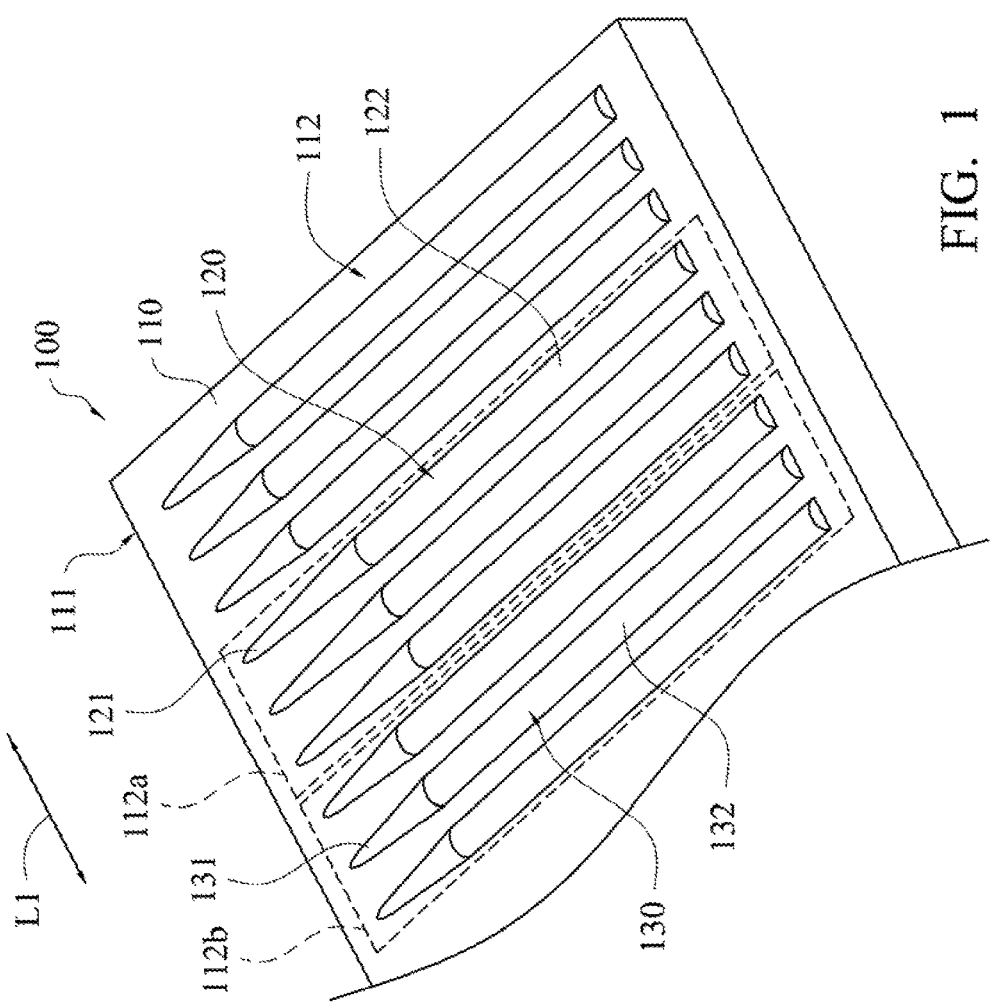
FIG. 1 is a schematic partial structural diagram showing a light guide plate in accordance with a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, FIG. 1 is a schematic partial structural diagram showing a light guide plate 100 in accordance with a first embodiment of the present invention. The light guide plate 100 of present embodiment mainly includes a main body 110, plural first stripe structures 120 and plural second stripe structures 130. The first stripe structures 120 and the second stripe structures 130 are disposed on the main body 110 and can be used to uniform light entering and emitted from the main body 110.

Referring to FIG. 1 again, the main body 110 has at least one light-incident surface 111 and a main surface 112, and the main surface 112 is connected to the light-incident surface 111. In the present embodiment, the main surface 112 is a light-emitting surface. In other embodiments, the main surface 112 can be a reflecting surface. As shown in FIG. 1, the main surface 112 includes plural first regions 112a and plural second regions 112b, and the first regions 112a and the second regions 112b are alternately arranged. More specifically, the first regions 112a and the second regions 112b are alternately arranged along a direction L1 which is substantially parallel to the light-incident surface 111. As shown in FIG. 1, the first stripe structures 120 are disposed in the first regions 112a, and the second stripe structures 130 are disposed in the second regions 112b. It is noted that, the dashed frames of FIG. 1 are merely used for indicating one of the first regions 112a and one of the second regions 112b, and are not parts of the light guide plate 100.

Referring to FIG. 1 again, in the present embodiment, an extending direction of the first stripe structures 120 and the second stripe structures 130 is substantially vertical to the light-incident surface 111. Moreover, each of the first stripe structures 120 has a first tapered portion 121 and a first body portion 122, and the first tapered portion 121 is connected to one end of the first body portion 122 near the light-incident surface 111. Each of the second stripe structures 130 has a second tapered portion 131 and a second body portion 132, in which the second tapered portion 131 is connected to one end of the second body portion 132 near the light-incident surface 111. As shown in FIG. 1, a width of each of the first tapered portions 121 and the second tapered portions 131 becomes greater from one end adjacent to the light-incident surface 111 to the other end away from the light-incident surface 111. In the present embodiment, an inherent type of the first stripe structures 120 is different from that of the second stripe structures 130. It is noted that, the "inherent type" used herein means lengths, depths, heights or shapes of the first stripe structures 120 and the second stripe structures 130. In the embodiment shown in FIG. 1, a length of the first stripe structures 120 is substantially equal to a length of the second stripe structures 130, but a length of the first tapered portion 121 of each of the first body portion 122 is different from a length of the second tapered portion 131 of each of the second stripe structures 130, and a length of the first body portion 122 of each of the first stripe structures 120 is different from a length of the second body portion 132 of each of the second stripe structures 130, so that the overall shape of each of the first stripe structures 120 is different from the overall shape of each of the second stripe structures 130. It is noted that, each of the first tapered portions 121 and the second tapered portions 131 are spaced from the light-incident surface 111 at a distance, and embodiments of the present invention are not limited thereto. In other embodiments, each of the first tapered portions 121 and the second tapered portions 131 can be connected to t he light-incident surface 111.

Figure 2A:
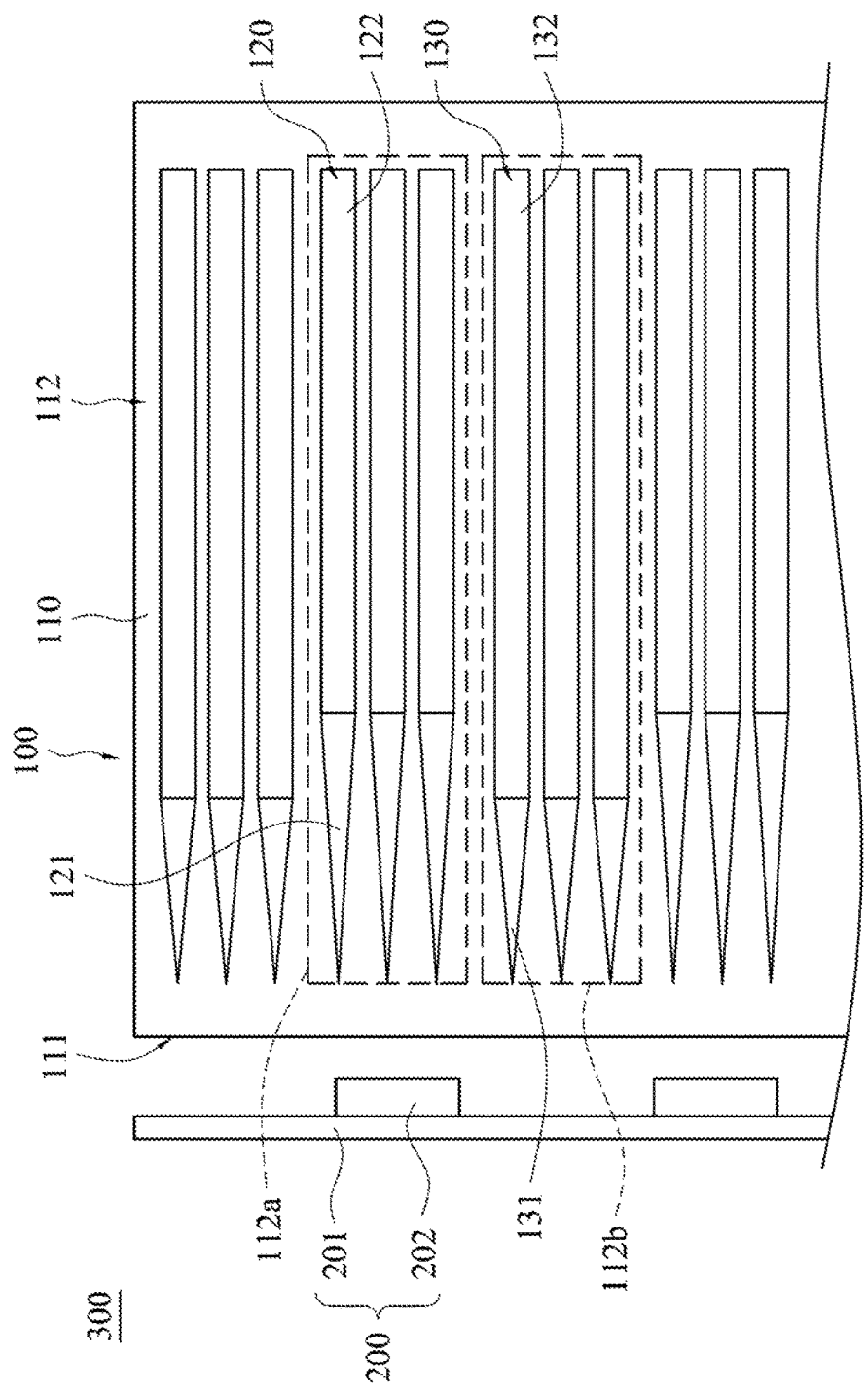
FIG. 2A is a schematic top view of a backlight module in accordance with the first embodiment of the present invention.
Figure 2B:
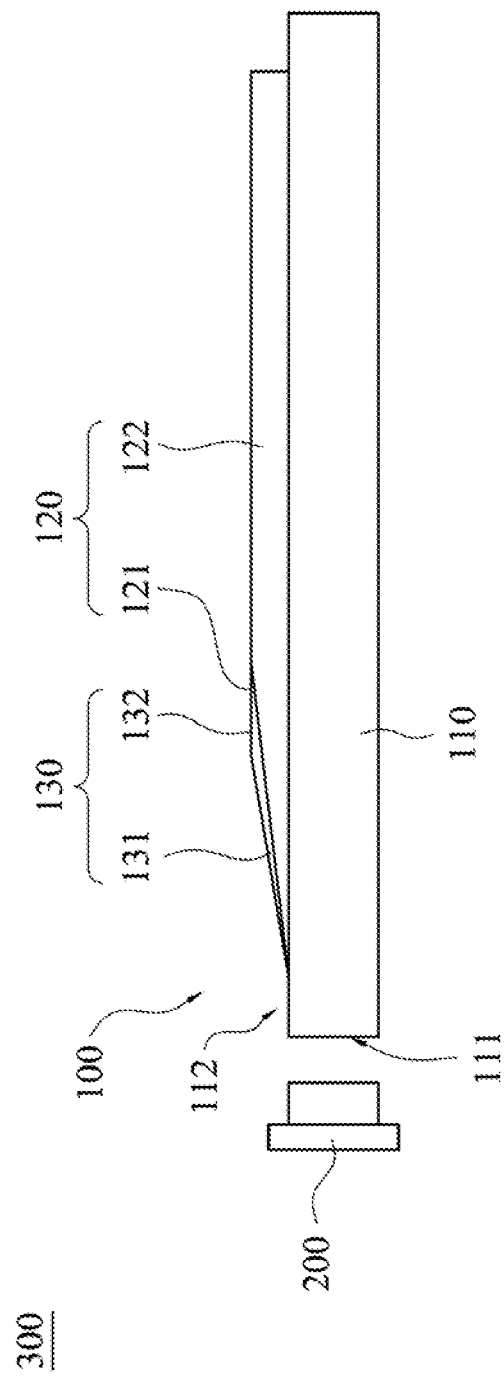
FIG. 2B is a schematic side view of the backlight module in accordance with the first embodiment of the present invention.

Referring to FIG. 2A and FIG. 2B, FIG. 2A and FIG. 2B are a schematic top view and a schematic side view of a backlight module 300 in accordance with the first embodiment of the present invention. The backlight module 300 of present embodiment mainly includes the aforementioned light guide plate 100 and a light source 200. The light source 200 includes a circuit board 201 and plural light-emitting diodes 202 disposed on the circuit board 201, in which the light-emitting diodes 202 are electrically connected to the circuit board 201. The light source 200 is disposed adjacent to the light-incident surface 111 of the light guide plate 100, and light generated from the light source 200 can enter the light guide plate 100 from the light-incident surface 111 of the light guide plate 100, in which the term "adjacent to" not limited to "being spaced from the light-incident surface 111 at a small distance" (as shown in FIG. 2A and FIG. 2B), and also refers to "the light source 200 directly contacting the light-incident surface 111".

As shown in FIG. 2A and FIG. 2B, in the present embodiment, the first regions 112a on the main surface 112 of the light guide plate 100 are correspondingly disposed in front of the light-emitting diodes 202, and the second regions 112b are disposed between every two adjacent first regions 112a. In other words, the first regions 112a and the second regions 112b are alternately arranged. Moreover, the first regions 112a and the second regions 112b are arranged according to the arrangement manner of the light-emitting diodes 202 arranged on the circuit board 201. Because luminance at a position in front of the light-emitting diodes 202 is stronger than a position between every two adjacent light-emitting diodes 202, the first tapered portion 121 of the first stripe structures 120 disposed in the first regions 112a are designed to be thin and long, and the second tapered portion 131 of the second stripe structures 130 disposed in the second regions 112b are designed to be wide and short. Moreover, a length of each of the second body portions 132 is greater than a length of each of the first body portions 122. Therefore, quantity of light emitted from the second stripe structures 130 is greater than quantity of light emitted from the first stripe structures 120, thereby increasing the luminance of light emitted from the second regions 112b, so that a degree of luminance uniformity of light emitted from the first regions 112a and second regions 112b can be increased.

Figure 3A:
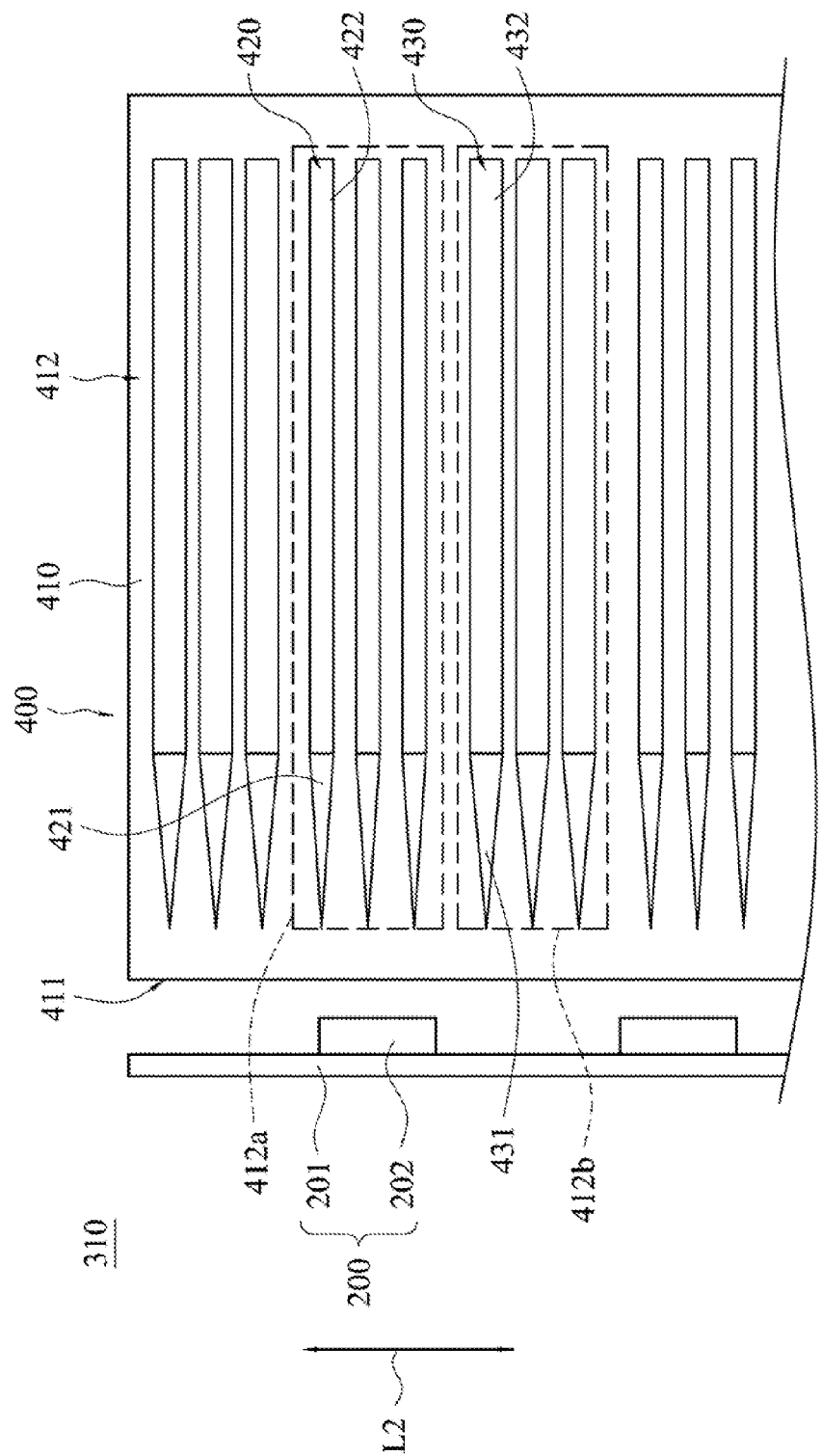
FIG. 3A is a schematic top view of a backlight module in accordance with a second embodiment of the present invention.
Figure 3B:
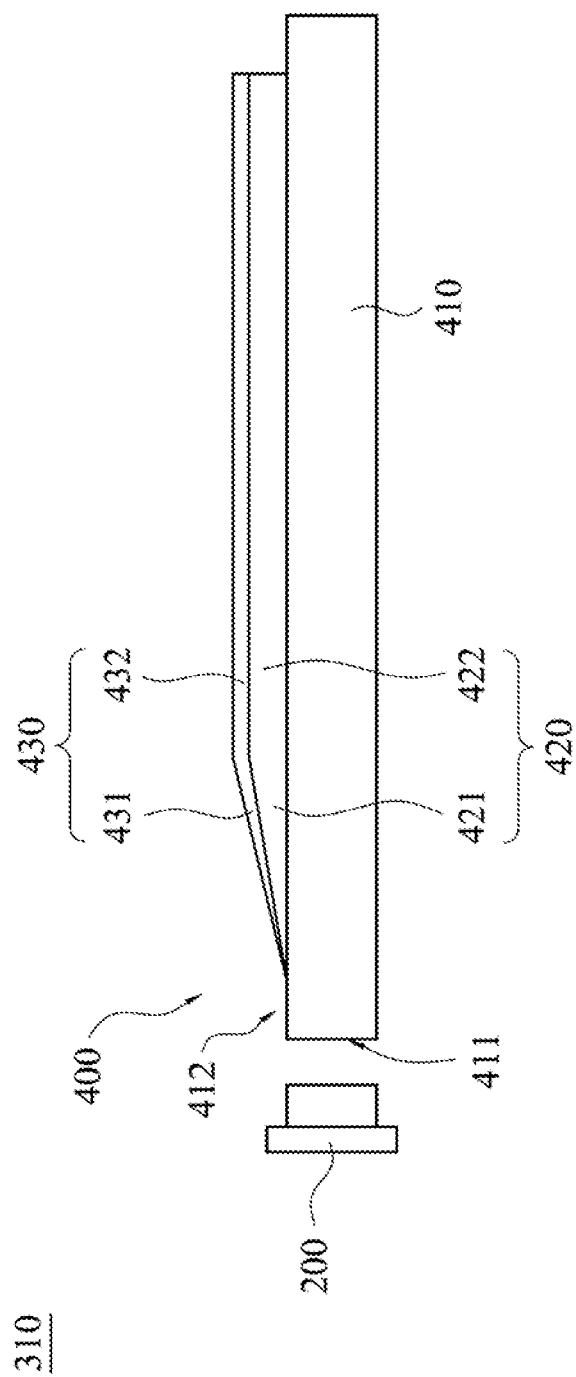
FIG. 3B is a schematic side view of the backlight module in accordance with the second embodiment of the present invention.

In the present invention, the first stripe structures and the second stripe structures of the light guide plate may have different designs. Referring to FIG. 3A and FIG. 3B, FIG. 3A and FIG. 3B is a schematic top view and a schematic side view of a backlight module 310 in accordance with a second embodiment of the present invention. The structure of the backlight module 310 of present embodiment is similar to that of the backlight module 300, and the main difference therebetween is that a light guide plate 400 of the backlight module 310 has different structures.

As shown in FIG. 3A and FIG. 3B, the light guide plate 400 of present embodiment mainly includes a main body 410 plural first stripe structures 420 and plural second stripe structures 430. The first stripe structures 420 and the second stripe structures 430 are disposed on the main body 410. The main body 410 has at least one light-incident surface 411 and a main surface 412, and the main surface 412 is connected to the light-incident surface 411. In the present embodiment, the main surface 412 is a light-emitting surface. In other embodiments, the main surface 412 can be a reflecting surface. As shown in FIG. 3A and FIG. 3B, the main surface 412 includes plural first regions 412a and plural second regions 412b, and the first regions 412a and the second regions 412b are alternately arranged. More specifically, the first regions 412a and the second regions 412b are alternately arranged along a direction L2 which is substantially parallel to the light-incident surface 411. The first stripe structures 420 are disposed in the first regions 412a, and the second stripe structures 430 are disposed in the second regions 412b.

Referring to FIG. 3A and FIG. 3B again, an extending direction of the first stripe structures 420 and the second stripe structures 430 is substantially vertical to the light-incident surface 411. Moreover, each of the first stripe structures 420 has a first tapered portion 421 and a first body portion 422, and the first tapered portion 421 is connected to one end of the first body portion 422 near the light-incident surface 411. Each of the second stripe structures 430 has a second tapered portion 431 and a second body portion 432, in which the second tapered portion 431 is connected to one end of the second body portion 432 near the light-incident surface 411. A width of each of the first tapered portions 421 and the second tapered portions 431 becomes greater from one end adjacent to the light-incident surface 411 to the other end away from the light-incident surface 411. As shown in FIG. 3A and FIG. 3B, each of the first stripe structures 420 and the second stripe structures 430 is a convex potion. A length of the first tapered portion 421 of each of the first stripe structures 420 is equal to a length of the second tapered portion 431 of each of the second stripe structures 430, and a length of each of the first body portion 422 of the first stripe structures 420 is equal to a length of the second body portion 432 of each of the second stripe structures 430. However, a height and a width of each of the first stripe structures 420 are different from a height and a width of each of the second stripe structures 430. Therefore, the overall shape of each of the first stripe structures 420 is different from the overall shape of each of the second stripe structures 430.

As shown in FIG. 3A and FIG. 3B, in the present embodiment, the first regions 412a on the main surface 412 of the light guide plate 400 are correspondingly disposed in front of the light-emitting diodes 202, and the second regions 412b are disposed between every two adjacent first regions 412a. Because luminance at a position in front of the light-emitting diodes 202 is stronger than a position between every two adjacent light-emitting diodes 202, width and a height of each of the first stripe structures 420 disposed in the first regions 412a are designed to be smaller than a width and a height of each of the second stripe structures 430 disposed in the second regions 412b. Therefore, quantity of light emitted from the second stripe structures 430 is greater than quantity of light emitted from the first stripe structures 420, thereby increasing the luminance of light emitted from the second regions 412b, so that the degrees of luminance uniformity of light emitted from the first regions 412a and second regions 412b can be increased. It is noted that, the first stripe structures 420 and the second stripe structures 430 which are convex structures is merely used as an example for explanation, and embodiments of the present invention are not limited thereto. In other embodiments, each of the first stripe structures 420 and the second stripe structures 430 can be designed into a concave structure having different depths according to different requirements so as to achieve the aforementioned objects which will not be described again herein.

Figure 4A:
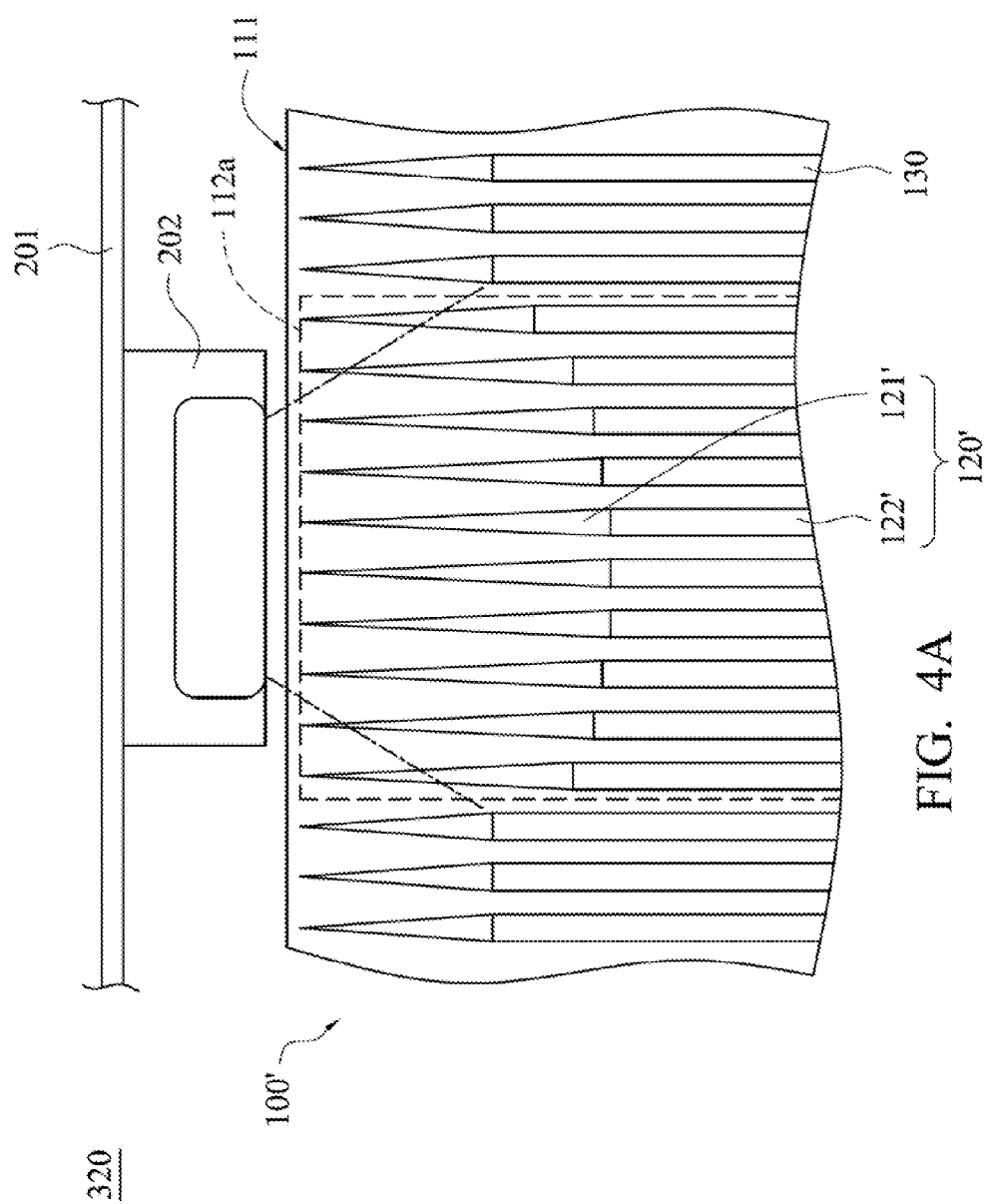
FIG. 4A is a schematic partial top view of a backlight module in accordance with a third embodiment of the present invention.

It is noted that, the shapes of the first stripe structures in the first regions which are designed to be the same is not used to limit the present invention. In other embodiments, shapes of the first stripe structures in the first region can be designed to be different according to a light distribution generated from light-emitting diodes. Referring to FIG. 4A, FIG. 4A is a schematic partial top view of a backlight module 320 in accordance with a third embodiment of the present invention. The structure of the backlight module 320 of present embodiment is similar to that of the backlight module 300, and the main difference therebetween is that a light guide plate 100' of the backlight module 320 has different structures.

As shown in FIG. 4A, in the light guide plate 100', shapes of the first stripe structure 120' are different. For example, if light emitted from each of the light-emitting diodes 202 is scattered into the light guide plate 100', a middle area of each of the first regions 112a near the light-incident surface 111 receives more light quantity than a side are of each of the first regions 112a near the light-incident surface 111. Therefore, the length of the first tapered portion 121' of each of the first stripe structures 120' can be designed according to a light distribution generated from light-emitting diodes 202. In the present embodiment, each of the first tapered portions 121' in the middle area of the first regions 112a is thinner and longer than each of the first tapered portions 121' in the side area of the first regions 112a. Moreover, each of the first body portions 122' in the middle area of the first regions 112a is shorter than each of the first body portion 122' in the side area of the first regions 112a. Therefore, light quantity emitted from the first stripe structures 120' in the side area of each of the first regions 112a is greater than that emitted from the first stripe structures 120' in the middle of each of the first regions 112a, so that the degrees of luminance uniformity of light emitted from the first regions 112a can be increased.

Figure 4B:
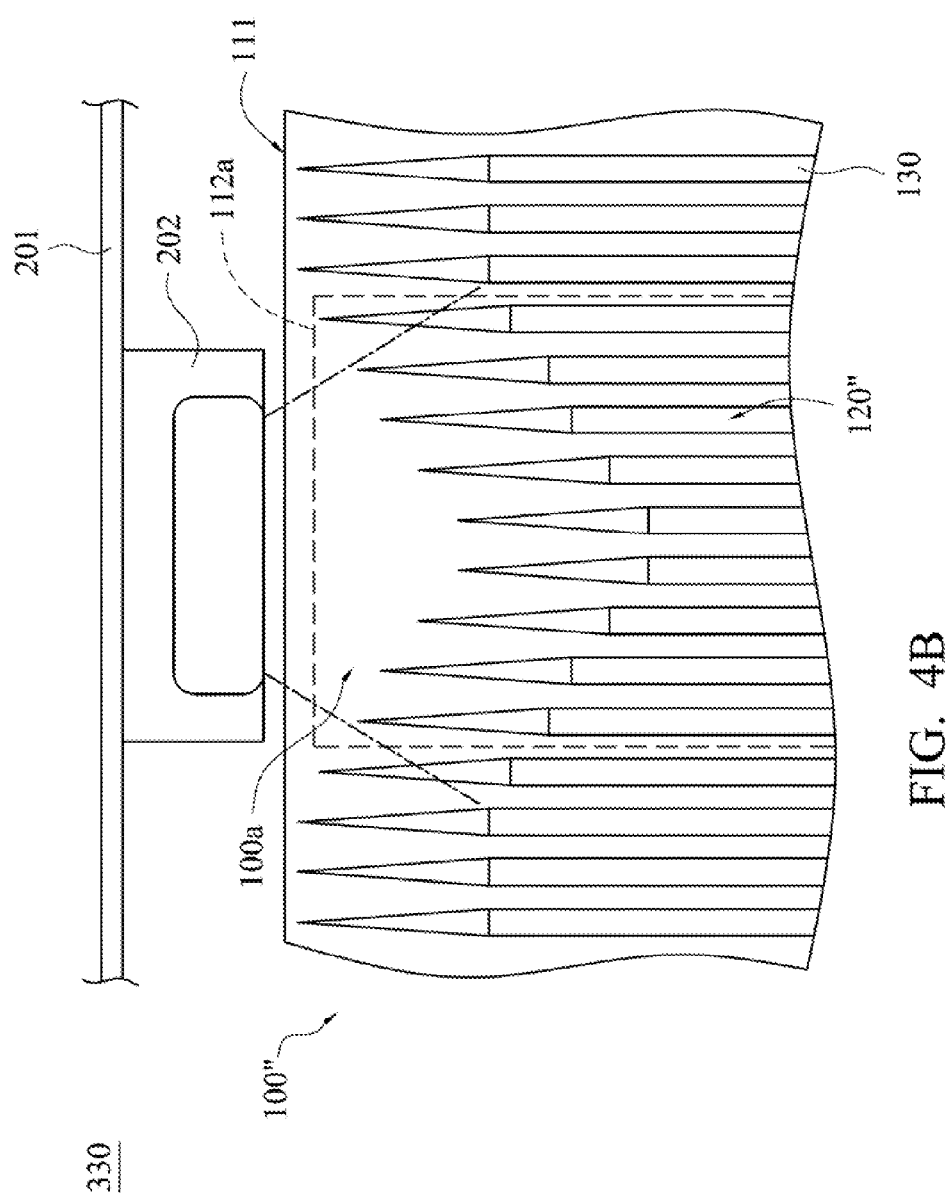
FIG. 4B is a schematic partial top view of a backlight module in accordance with a fourth embodiment of the present invention.

It is noted that, in the aforementioned embodiments, a distance between each first stripe structure in the first region and the light-emitting diode corresponding to the first region is equal to a distance between each second stripe structure in the second region and the light-emitting diode corresponding to the second region. In other embodiments, the distance between each first stripe structure in the first region and the corresponding light-emitting diode can be designed according to a light distribution generated from light-emitting diodes. Referring to FIG. 4B, FIG. 4B is a schematic partial top view of a backlight module 330 in accordance with a fourth embodiment of the present invention. The structure of the backlight module 330 of present embodiment is similar to that of the backlight module 320, and the main difference therebetween is that a light guide plate 100" of the backlight module 330 has different structures.

As shown in FIG. 4B, in the light guide plate 100", lengths of the first stripe structures 120" in the each of the first regions 112a are different, and distances between each first stripe structure 120" in the each of the first regions 112a and the light-incident surface 111 are also different. For example, if light emitted from each of the light-emitting diodes 202 is scattered into the light guide plate 100", a middle area of each of the first regions 112a near the light-incident surface 111 receives more light quantity than a side area of each of the first regions 112a near the light-incident surface 111. Therefore, lengths of the first stripe structures 120" and distances between each first stripe structure 120" and the light-incident surface 111 can be designed according to a light distribution generated from light-emitting diodes 202. In the present embodiment, the distances between the first stripe structures 120" located in the middle area of each of the first regions 112a and the light-emitting diode 202 corresponding to the each of the first regions 112a are greater than the distances between the first stripe structures 120" located in the side area of each of the first regions 112a and the light-emitting diode 202 corresponding to the each of the first regions 112a, thereby forming a fan-shaped blank area 100a between the first stripe structures 120" in each of the first regions 112a and the light-emitting diode 202 corresponding to the each of the first regions 112a. Therefore, light quantity emitted from the first stripe structures 120" in the side area of the first regions 112a is greater than that emitted from the first stripe structures 120" in the middle of the first regions 112a, so that the luminance of light emitted from the first regions 112a can be more uniform.

Figure 5A:
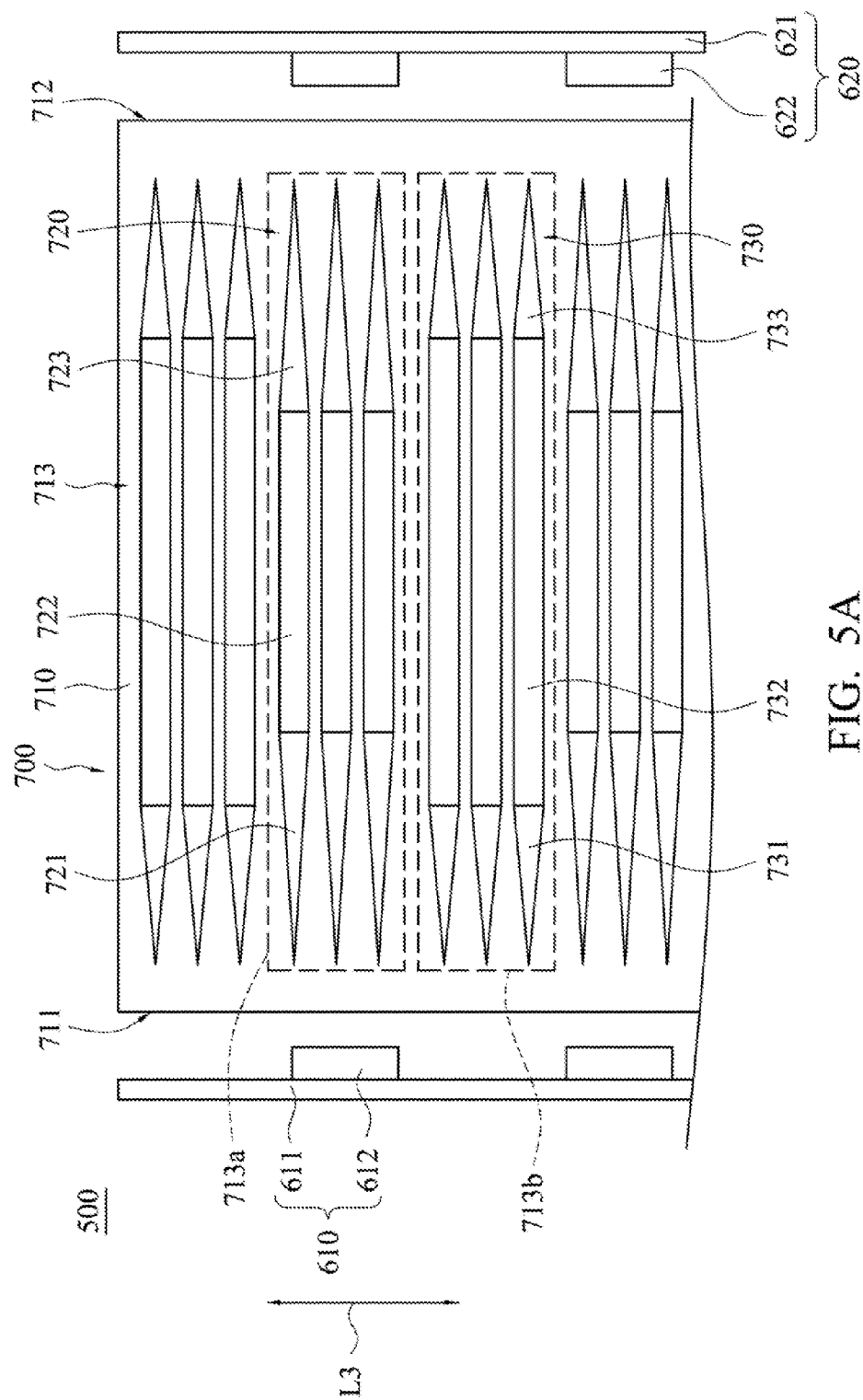
FIG. 5A is a schematic top view of a backlight module in accordance with a fifth embodiment of the present invention.
Figure 5B:
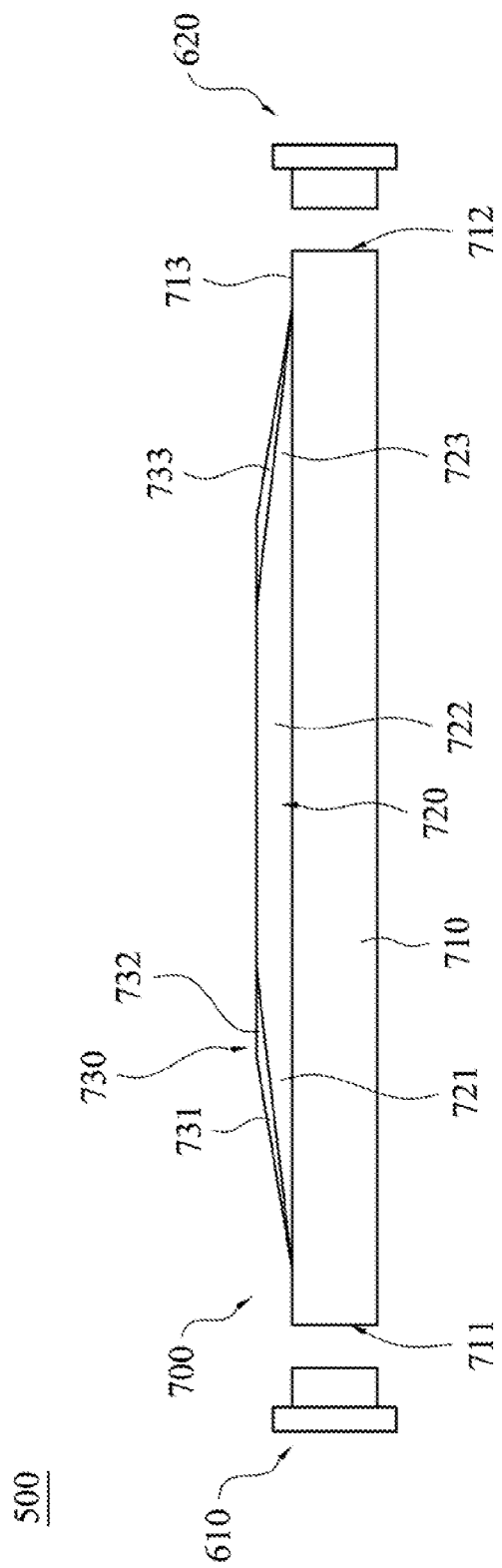
FIG. 5B is a schematic side view of the backlight module in accordance with the fifth embodiment of the present invention.

It is noted that, the light guide plate having one light-incident surface is merely used as an example for explanation, and embodiments of the present invention are not limited thereto. In other embodiments, the light guide plate can be designed to have two light-incident surfaces to meet different requirements. Referring to FIG. 5A and FIG. 5B, FIG. 5A and FIG. 5B are a schematic top view and a schematic side view of a backlight module 500 in accordance with a fifth embodiment of the present invention. In the present embodiment, the backlight module 500 includes a first light source 610, a second light source 620 and a light guide plate 700. The light guide plate 700 mainly includes a main body 710, plural first stripe structures 720 and plural second stripe structures 730. The first stripe structures 720 and the second stripe structures 730 are disposed on the main body 710 and are used to uniform light entering and emitted from the main body 710.

Referring to FIG. 5A and FIG. 5B, the main body 710 has a first light-incident surface 711, a second light-incident surface 712 and a main surface 713. In the embodiment, the first light-incident surface 711 and the second light-incident surface 712 are respectively connected to two opposite sides of the main surface 713. In the present embodiment, the main surface 713 is a light-emitting surface. In other embodiments, the main surface 713 can be a reflecting surface. As shown in FIG. 5A and FIG. 5B, the main surface 713 includes plural first regions 713a and plural second regions 713b, and the first regions 713a and the second regions 713b are alternately arranged. More specifically, the first regions 713a and the second regions 713b are alternately arranged along a direction L3 which is substantially parallel to the light-incident surface 711. As shown in FIG. 5A and FIG. 5B, the first stripe structures 720 are disposed in the first region 713a, and the second stripe structures 730 are disposed in the second region 713b.

Referring to FIG. 5A and FIG. 5B again, in the present embodiment, an extending direction of the first stripe structures 720 and the second stripe structures 730 is substantially vertical to the first light-incident surface 711 and the second light-incident surface 712. In the present embodiment, each of first stripe structures 720 has a first tapered portion 721, a first body portion 722 and a third tapered portion 723. The first tapered portion 721 is connected to one end of the first body portion 722 near the first light-incident surface 711, and third tapered portion 723 is connected to the other end of the first body portion 722 near the second light-incident surface 712. Moreover, each of the second stripe structures 730 has a second tapered portion 731, a second body portion 732 and a fourth tapered portion 733. The second tapered portion 731 is connected to one end of the second body portion 732 near the first light-incident surface 711, and the fourth tapered portion 733 is connected to the other end of the second body portion 732 near the second light-incident surface 712. As shown in FIG. 5A and FIG. 5B, a width of each of the first tapered portion 721 and the second tapered portion 731 becomes greater from one end adjacent to the light-incident surface 711 to the other end away from the light-incident surface 711. Similarly, a width of each of the third tapered portion 723 and the fourth tapered portion 733 becomes greater from one end adjacent to the second light-incident surface 712 to the other end away from the second light-incident surface 712. In the present embodiment, an inherent type of the first stripe structures 720 is different from an inherent type of the second stripe structures 730.

Referring to FIG. 5A and FIG. 5B again, the first light source 610 includes a circuit board 611 and plural light-emitting diodes 612 disposed on the circuit board 611, in which the light-emitting diodes 612 are electrically connected to the circuit board 611. The first light source 610 is disposed adjacent to the first light-incident surface 711 of the light guide plate 700, and light generated from the first light source 610 can enter the light guide plate 700 from the first light-incident surface 711 of the light guide plate 700. The second light source 620 includes a circuit board 621 and plural light-emitting diodes 622 disposed on the circuit board 621, in which the light-emitting diodes 622 are electrically connected to the circuit board 621. The second light source 620 is disposed adjacent to the second light-incident surface 712 of the light guide plate 700, and light generated from the second light source 620 can enter the light guide plate 700 from the second light-incident surface 712 of the light guide plate 700. It is noted that, the term "adjacent to" not limited to "being spaced from the first light-incident surface 711 at a small distance" (or "being spaced from the second light-incident surface 712 at a small distance") (as shown in FIG. 5A and FIG. 5B), and also refers to "the first light source 610 directly contacting the first light-incident surface 711" (or "the second light source 620 directly contacting the second light-incident surface 712").

In the present embodiment, the first regions 713a on the main surface 713 of the light guide plate 700 are correspondingly disposed in front of the light-emitting diodes 612 and 622, and the second regions 713b are disposed between every two adjacent first regions 713a. Therefore, the first tapered portion 721 and the third tapered portion 723 of the first stripe structures 720 disposed in the first regions 112a are designed to be thin and long, and the second tapered portion 731 and the fourth tapered portion 733 of the second stripe structures 730 disposed in the second regions 713b are designed to be wide and short. Moreover, a length of each of the second body portions 732 is greater than a length of each of the first body portions 722. Therefore, light quantity emitted from the second stripe structures 730 is greater than that emitted from the first stripe structures 720, thereby increasing the degrees of luminance uniformity of light emitted from the first region 713a and second region 713b.

It is noted that, in other embodiments, lengths, heights, depths of the first stripe structures 720 and the second stripe structures 730, or distances between each of the first stripe structures 720 and the second stripe structures 730 and the first light-incident surface 711 can be varied according to different requirements, so as to achieve the aforementioned objects. In addition, each of the first stripe structures 720 and the second stripe structures 730 in the present embodiment which has two tapered portions is not limited to be applied to a light guide plate having two light-incident surfaces, but can also be applied to a light guide plate having only one light-incident surface.

Figure 6:
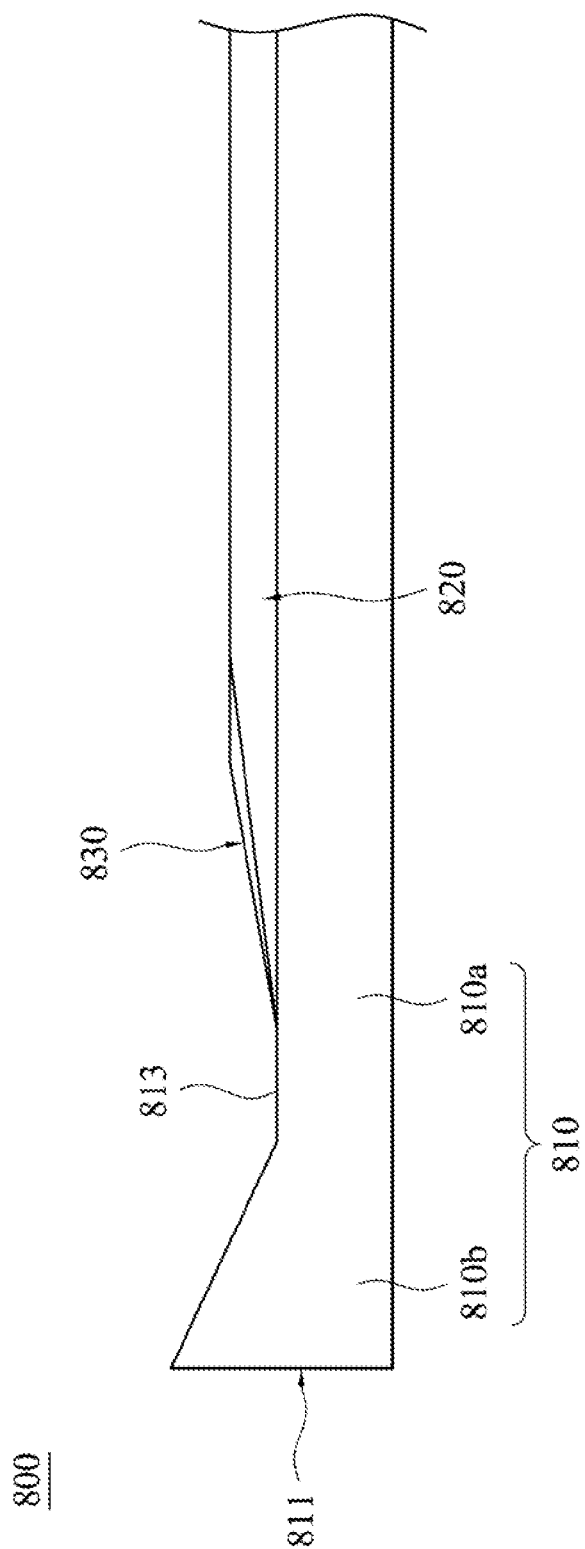
FIG. 6 is a schematic partial side view of a light guide plate in accordance with a sixth embodiment of the present invention.

The light guide plate of the present invention is not limited to be a flat plate with a uniform thickness. In other embodiments, the light guide plate of the present invention can also be a tapered light guide plate. Referring to FIG. 6, FIG. 6 is a schematic partial side view of a light guide plate 800 in accordance with a sixth embodiment of the present invention. As shown in FIG. 6, the light guide plate 800 includes a main body 810, plural first stripe structures 820 and plural second stripe structures 830. In the present embodiment, the main body 810 includes a plate portion 810a and a tapered portion 810b connected to the plate portion 810a. The light-incident surface 811 is located on a side of the tapered portion 810b, and the main surface 813 is located on the plate portion 810a. In the present embodiment, the first stripe structures 820 and the second stripe structures 830 are disposed on the main surface 813 of the plate portion 810a. In other embodiments, the first stripe structures 820 and the second stripe structures 830 can be simultaneously disposed on both of the tapered portion 810b and plate portion 810a. It is noted that, structures of the first stripe structures 820 are similar to those of the aforementioned first stripe structures 120, 420, 120', 120" and 720, and structures of the second stripe structures 830 are similar to those of the aforementioned second stripe structures 130, 430 and 730, which will not be described again herein.

Figure 7A:
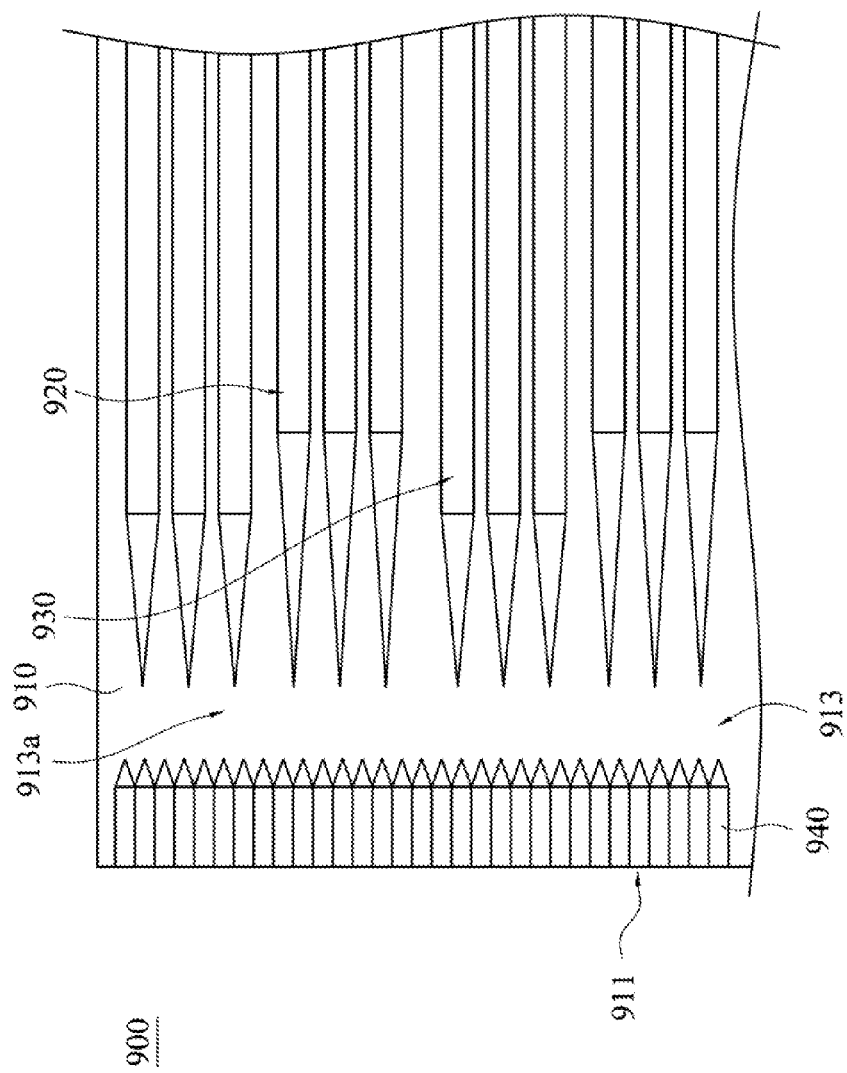
FIG. 7A is a schematic partial top view of a light guide plate in accordance with a seventh embodiment of the present invention.

Referring to FIG. 7A and FIG. 7B, FIG. 7A and FIG. 7B are a schematic partial top view and a schematic partial side view of a light guide plate 900 in accordance with a seventh embodiment of the present invention. The light guide plate 900 of the present embodiment includes a main body 910, plural first stripe structures 920 and plural second stripe structures 930. The main body 910 includes a light-incident surface 911 and a main surface 913 connected to the light-incident surface 911. The first stripe structures 920 and the second stripe structures 930 are disposed on the main surface 913. In the present embodiment, the light guide plate 900 further includes plural microstructures 940 disposed on the main surface 913 adjacent to the light-incident surface 911. The microstructures 940 are used to mix light entering a light-incident portion of the light guide plate 900, thereby improving luminance uniformity and light-emitting quality of the light guide plate 900. In one embodiment, the microstructures 940 are not connected to the first stripe structures 920 and the second stripe structures 930, and there is a blank portion 913a between the microstructures 940 and both the first stripe structures 920 and the second stripe structures 930. Therefore, light that passes through the microstructures 940 and is not guided out therefrom can be totally reflected by the blank portion 913a and propagate towards the direction away from the light-incident surface 911 of the light guide plate 900. After the light totally reflected by the blank portion 913a passes through and adjusted by the first stripe structures 920 and the second stripe structures 930, luminance of exit light can be more uniform. In some embodiments, each of the microstructures 940 can be a convex stripe structure or a concave stripe structure. It is noted that, structures of the first stripe structures 920 and the second stripe structures 930 are similar to those of the aforementioned first stripe structures 120, 420, 120', 120" and 720 and the aforementioned second stripe structures 130, 430 and 730, and will not be described again herein.

Figure 8A:
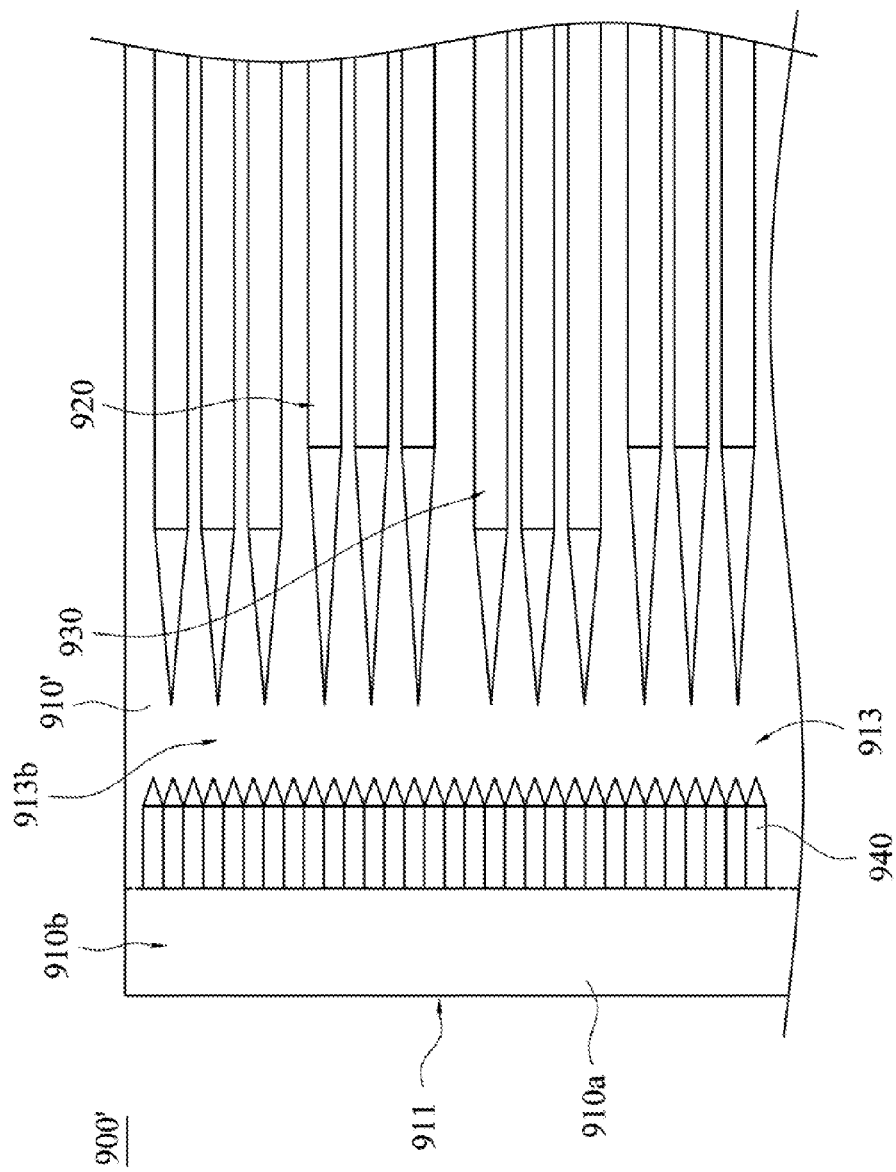
FIG. 8A is a schematic partial top view of a light guide plate in accordance with an eighth embodiment of the present invention.
Figure 8B:
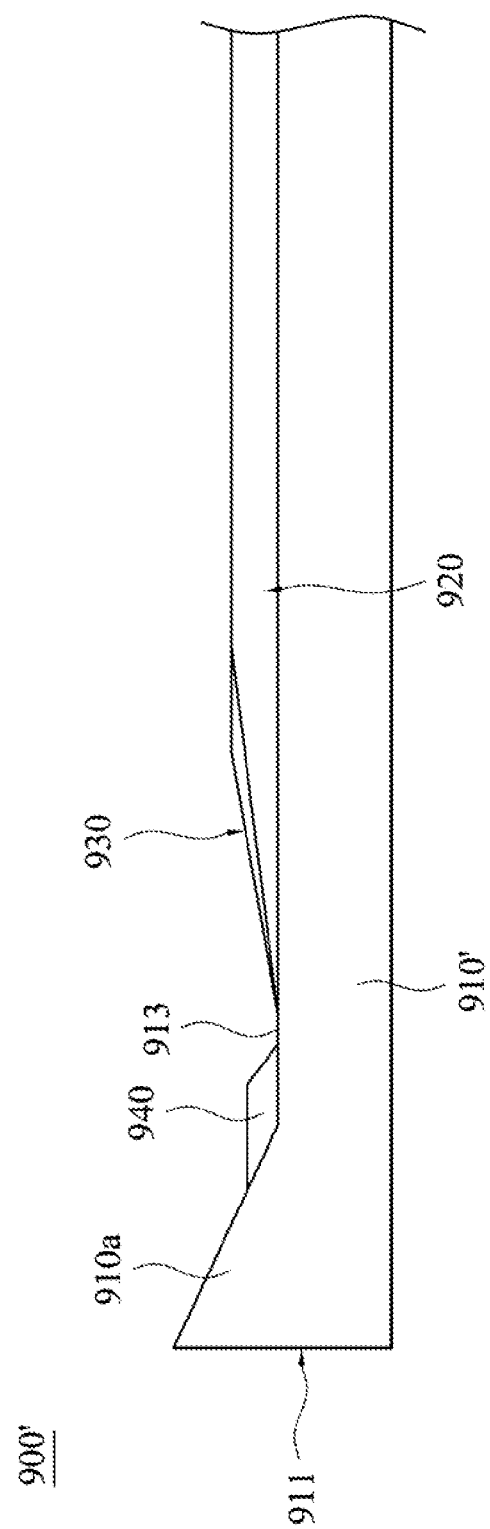
FIG. 8B is a schematic partial side view of the light guide plate in accordance with the eighth embodiment of the present invention.

Referring to FIG. 8A and FIG. 8B, FIG. 8A and FIG. 8B are a schematic partial top view and a schematic partial side view of a light guide plate 900' in accordance with an eighth embodiment of the present invention. The structure of the light guide plate 900' of present embodiment is similar to that of the light guide plate 900, and the main difference therebetween is that light guide plate 900 has a tapered portion 910a. The microstructures 940 are disposed on the main surface 913 and are connected to the tapered portion 910a. The microstructures 940 are used to mix light entering a light-incident portion of the light guide plate 900', thereby increasing light-emitting quality of the light guide plate 900'. In one embodiment, the microstructures 940 are not connected to the first stripe structures 920 and the second stripe structures 930, and there is a first blank portion 913b between the microstructures 940 and both the first stripe structures 920 and the second stripe structures 930. Similarly, the microstructures 940 are not connected to the light-incident surface 911, and there is a second blank portion 910b between the light-incident surface 911 and the microstructures 940. Therefore, light that enters the light-incident surface 911 can be first totally reflected by the second blank portion 910b, and then propagates towards the microstructures 940. After passing through microstructures 940 and not being guided out therefrom light can be totally reflected by the first blank portion 913b and propagates towards the direction away from the light-incident surface 911. After the light totally reflected by the first blank portion 913b and the second blank portion 910b passes through and adjusted by the first stripe structures 920 and the second stripe structures 930, luminance of exit light can be more uniform.

Figure 9:
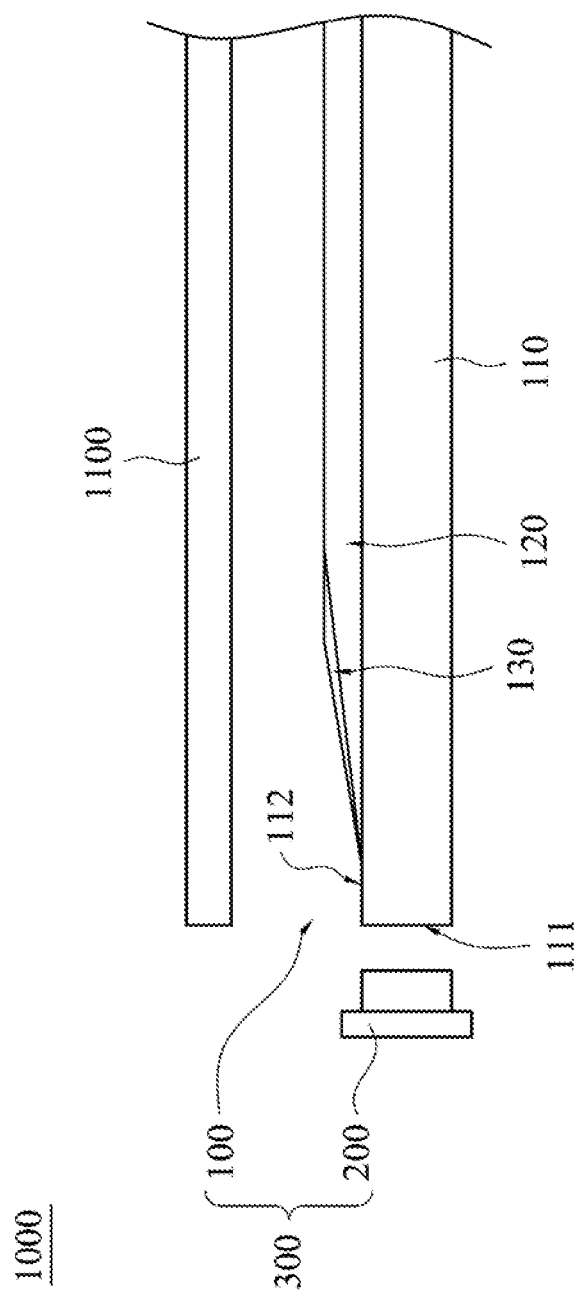
FIG. 9 is a schematic partial side view of a display device in accordance with an embodiment of the present invention.

Referring to FIG. 9, FIG. 9 is a schematic partial side view of a display device 1000 in accordance with an embodiment of the present invention. The display device 1000 includes the backlight module 300 as shown in FIG. 2B and a display panel 1100. As shown FIG. 9, the display panel 1100 is disposed in front of the backlight module 300 so as to achieve the same object as described above, and therefore will not be described again herein. It is noted that, the backlight module 300 shown in FIG. 2B is merely used as an example applied to the display device 1000 for explanation, and embodiments of the present invention are not limited thereto. In other embodiments, other backlight modules (such as the backlight module 310, 330 and 500) and light guide plates (such as the light guide plates 800, 900 and 900') of the aforementioned embodiments also can be applied to a display device, so as to achieve the same effect.

Therefore, light which is not guided out from the microstructures 940 can be totally reflected by the blank portion 913a and propagate towards the direction away from the light-incident surface 911 of the light guide plate 900. After the light totally reflected by the blank portion 913a passes through and adjusted by the first stripe structures 920 and the second stripe structures 930, luminance of exit light can be more uniform. In some embodiments, each of the microstructures 940 can be a convex stripe structure or a concave stripe structure. It is noted that, structures of the first stripe structures 920 and the second stripe structures 930 are similar to those of the aforementioned first stripe structures 120, 420, 120', 120" and 720 and the aforementioned second stripe structures 130, 430 and 730, and will not be described again herein.

It can be known from the aforementioned embodiments of the present invention that, the light guide plate has different first stripe structures and second stripe structures disposed on the main surface of the light guide plate, and the shapes and the structures of the first stripe structures and the second stripe structures are design according to a luminous intensity and a light distribution generated from the light source, thereby increasing the degree of the luminance uniformity of the backlight module and the display device.

In addition, in different embodiments, the main surface near the light-incident surface can be implemented with plural microstructures, and these microstructures are used to mix light entering the light-incident portion of the light guide plate, thereby enhancing the luminance uniformity of the light guide plate.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A backlight module, comprising:
a light guide plate; and
at least one light source disposed adjacent to at least one light-incident surface of the light guide plate, wherein the light source comprises a circuit board and a plurality of light-emitting diodes disposed on the circuit board;
wherein the light guide plate comprises:
a main body having at least one light-incident surface and a main surface connected to the at least one light-incident surface;
a plurality of first stripe structures arranged on a plurality of first regions of the main surface, wherein each of the first stripe structures has a first tapered portion; and
a plurality of second stripe structures arranged on a plurality of second regions of the main surface, wherein each of the second stripe structures has a second tapered portion;
wherein the first regions and the second regions of the main surface are alternately disposed, and a width, a height, or a depth of the second stripe structures is different from a width, a height, or a depth of the first stripe structures;
wherein the first regions are respectively disposed in front of the light sources, and the second regions are disposed between every two adjacent first regions;
wherein the width, the height, or the depth of each of the first stripe structures disposed in the first regions are designed to be smaller than the width, the height, or the depth of each of the second stripe structures disposed in the second regions.

2. The backlight module of claim 1, wherein
an extending direction of each of the first stripe structures and the second stripe structures is vertical to the light-incident surface; and
a width of each of the first tapered portions and the second tapered portions becomes greater from one end adjacent to the light-incident surface to the other end away from the light-incident surface.

3. The backlight module of claim 1, wherein
the at least one light-incident surface comprises a first light-incident surface and a second light-incident surface opposite to the first light-incident surface;
each of the first stripe structures further has a third tapered portion opposite to the first tapered portion; and
each of the second stripe structures further has a fourth tapered portion opposite to the second tapered portion.

4. The backlight module of claim 3, wherein a width of each of the third tapered portions and the fourth tapered portions becomes greater from one end adjacent to the second light-incident surface to the other end away from the second light-incident surface.

5. The backlight module of claim 3, wherein a length of the third tapered portion of each of the first stripe structures is different from a length of the fourth tapered portion of each of the second stripe structures.

6. The backlight module of claim 1, wherein a width of each of the first stripe structures is different from a width of each of the second stripe structures.

7. The backlight module of claim 1, wherein each of the first stripe structures and the second stripe structures is a concave portion, and a depth of each of the first stripe structures is different from a depth of each of the second stripe structures.

8. The backlight module of claim 1, wherein each of the first stripe structures and the second stripe structures is a convex portion, and a height of each of the first stripe structures is different from a height of each of the second stripe structures.

9. The backlight module of claim 1, wherein
each of the first stripe structures has a first body portion;
each of the second stripe structures has a second body portion; and
a length of the first body portion of the each of the first stripe structures is different from a length of the second body portion of each of the second stripe structures.

10. The backlight module of claim 1, wherein a length of the first tapered portion of each of the first stripe structures is different from a length of the second tapered portion of each of the second stripe structures.

11. The backlight module of claim 1, wherein the main surface is a light-emitting surface or a reflecting surface.

12. The backlight module of claim 1, wherein a fan-shaped blank area is defined between the first stripe structures in each of the first regions and the light-emitting diode corresponding to the each of the first regions.

13. The backlight module of claim 1, wherein in an extending direction of each of the first stripe structures and the second stripe structures, a distance between each of the first stripe structures in the first regions and the light-emitting diodes is equal to a distance between each of the second stripe structures in the second regions and the light-emitting diodes.

14. A display device, comprising:
a backlight module as claimed in claim 1; and
a display panel disposed in front of the light guide plate.

* * * * *